United States Patent
Kim

(10) Patent No.: US 9,406,382 B2
(45) Date of Patent: Aug. 2, 2016

(54) SINGLE POLY EEPROM DEVICE

(71) Applicant: CHANGWON NATIONAL UNIVERSITY INDUSTRY ACADEMY COOPERATION CORPS, Chanwon-si, Gyeongnam (KR)

(72) Inventor: Young-Hee Kim, Chanwon-si (KR)

(73) Assignee: CHANGWON NATIONAL UNIVERSITY ACADEMY COOPERATION CORPS, Changwon-Si, Gyeongnam (KR)

(*) Notice: Subject to any disclaimer, the term of this patent is extended or adjusted under 35 U.S.C. 154(b) by 0 days.

(21) Appl. No.: 14/174,273

(22) Filed: Feb. 6, 2014

(65) Prior Publication Data

US 2015/0138892 A1 May 21, 2015

(30) Foreign Application Priority Data

Nov. 18, 2013 (KR) ........................ 10-2013-0139574

(51) Int. Cl.
 *G11C 16/04* (2006.01)
 *H01L 29/788* (2006.01)
 *H01L 27/115* (2006.01)

(52) U.S. Cl.
 CPC ...... *G11C 16/0433* (2013.01); *H01L 27/11558* (2013.01); *H01L 29/7883* (2013.01)

(58) Field of Classification Search
 USPC ..................... 365/185.17, 185.21; 257/1, 326
 See application file for complete search history.

(56) References Cited

U.S. PATENT DOCUMENTS

| | | | |
|---|---|---|---|
| 6,323,517 B1* | 11/2001 | Park | H01L 29/42324 257/314 |
| 2001/0022359 A1* | 9/2001 | Mehta | 257/1 |
| 2011/0176248 A1* | 7/2011 | Nakahara | H01L 27/027 361/91.1 |

FOREIGN PATENT DOCUMENTS

| | | |
|---|---|---|
| KR | 10-2009-0070344 | 7/2009 |
| KR | 10-2013-0056545 | 5/2013 |
| KR | 10-1357847 | 2/2014 |

OTHER PUBLICATIONS

"Design of 512-bit logic process-based single poly EEPROM IP" by Jin Li-yan, Jang Ji-Hye, Yu Yi-ning, Ha Pan-Bong, Kim Young-Hee, Central South University Press and Springer-Verlag Berlin Heidelberg 2011 pp. 2036-2044.*

Design of 512-bit logic process-based single poly EEPROM IP byJin Li-yan(金丽妍), Jang Ji-Hye, Yu Yi-ning(余忆宁), Ha Pan-Bong, Kim Young-Hee Department of Electronic Engineering, Changwon National University, C hangwon 641-773, Korea © Central South University Press and Springer-Verlag Berlin Heidelberg 2011.*

* cited by examiner

*Primary Examiner* — Shawki S Ismail
*Assistant Examiner* — Muhammad S Islam
(74) *Attorney, Agent, or Firm* — Kile Park Reed & Houtteman PLLC

(57) ABSTRACT

The present invention proposes a single poly EEPROM cell including a first control gate capacitor, a first tunnel gate capacitor, a first sense transistor, and a first selection transistor. In a single poly EEPROM cell according to the present invention, a Fowler Nordheim (FN) tunneling method is used in order to increase the recognition distance of an RFID tag chip in mode. In a single poly EEPROM device including a single poly EEPROM cell, the single poly EEPROM cell includes a first control gate capacitor MC1, a first tunnel gate capacitor MC2, a first sense transistor MN1, and a first selection transistor MN2, and the first sense transistor MN1 and the first selection transistor MN2 share a P type well PW.

7 Claims, 13 Drawing Sheets

Fig. 3

| Signal | Selected Cell | Non Selected Cell |
|---|---|---|
| Control Gate (CG) | -4.75V | 0V |
| Tunnel Gate (TG) | 4.75V | 4.75V |
| Word Line (WL) | Floating | Floating |
| Bit Line (BL) | 4.75V-Vγ | 4.75V-Vγ |
| Deep N Well (DNW) | 4.75V | 4.75V |

Fig. 4

| Signal | Selected Cell | | Non Selected Cell | |
|---|---|---|---|---|
| | DIN=1 | DIN=0 | DIN=1 | DIN=0 |
| Control Gate (CG) | 4.75V | 4.75V | 0V | 0V |
| Tunnel Gate (TG) | -4.75V | 0V | -4.75V | 0V |
| Word Line (WL) | 0V | 0V | 0V | 0V |
| Bit Line (BL) | Floating | Floating | Floating | Floating |
| Deep N Well (DNW) | 4.75V | 4.75V | 4.75V | 4.75V |

Fig. 5

| Signal | Selected Cell | | Non Selected Cell | |
|---|---|---|---|---|
| | DIN=1 | DIN=0 | DIN=1 | DIN=0 |
| Control Gate (CG) | 1.2V | 1.2V | 0V | 0V |
| Tunnel Gate (TG) | 0V | 0V | 0V | 0V |
| Word Line (WL) | 1.2V | 1.2V | 0V | 0V |
| Bit Line (BL) | $1.2V-V_T$ | 0V | X | X |
| Deep N Well (DNW) | 1.2V | 1.2V | 1.2V | 1.2V |

| MODE | Erase | Program | Read |
|---|---|---|---|
| Control Gate (CG) | -VPP | VPP | Sweep |
| Tunnel Gate (TG) | VPP | -VPP | 0V |
| Word Line (WL) | 0V | 0V | 1.2V |
| Bit Line (BL) | Floating | Floating | 0.1V |

Fig. 6

SINGLE POLY EEPROM DEVICE

BACKGROUND OF THE INVENTION

1. Field of the Invention

The present invention relates to a single poly EEPROM device, and more particularly, to a single poly EEPROM device which can reduce the size of a single poly EEPROM cell, that is, an element of the single poly EEPROM device, without deteriorating characteristics and reduce the number of MOS devices used therein.

2. Description of the Related Art

An RFID is radio frequency recognition technology that provides various services by collecting, storing, modifying, and tracking information about objects and peripheral information using radio waves from tags attached to the objects. A tag chip includes an analog circuit, a logic circuit, and a memory IP. EEPROM, that is, non-volatile memory capable of being read and written and retaining stored information although power is not supplied, is chiefly used as the memory IP. There is a need for an EEPROM IP using a single poly EEPROM cell having a small area in order to reduce the cost of a tag chip.

A conventional single poly EEPROM cell does not use an additional mask or uses one additional mask in a common CMOS process, has a small size, and uses a Fowler Nordheim (FN) tunneling method having a lower current than a Channel Hot Electron (CHE) method or a Band To Band Tunneling (BTBT) method in erase mode and program mode. The FN tunneling method is a quantum tunnel effect and a method of electrically rewriting data using FN tunneling. A single poly EEPROM device is used for an RFID tag chip because a small additional mask, a short Turn Around Time (TAT), and a low manufacturing cost.

A conventional single poly EEPROM cell includes a control gate capacitor, a tunnel gate capacitor, a sense transistor, and a selection transistor. The sense transistor and the selection transistor are problematic in that they occupy a large area because the transistor is formed in each well process.

SUMMARY OF THE INVENTION

Accordingly, the present invention has been made in an effort to solve the problems occurring in the related art, and an object of the present invention is to provide a single poly EEPROM device which can reduce the size of a single poly EEPROM cell without deteriorating common characteristics and reduce the number of MOS devices used therein.

In order to achieve the above object, according to one aspect of the present invention, there is provided a single poly EEPROM device including a single poly EEPROM cell, wherein the single poly EEPROM cell includes a first control gate capacitor MC1 having a first terminal connected to a control gate (CG) signal, a first tunnel gate capacitor MC2 having a first terminal and a second terminal connected to a tunnel gate (TG) signal and a third terminal connected to a second terminal of the first control gate capacitor, a first sense transistor MN1 having a second terminal connected to a virtual ground VSS and a third terminal connected to the second terminal of the first control gate capacitor, and a first selection transistor MN2 having a first terminal connected to a bit line (BL) signal, a second terminal connected to a first terminal of the first sense transistor MN1, and a third terminal connected to a word line (WL) signal, wherein the first sense transistor MN1 and the first selection transistor MN2 share a P type well PW.

According to another aspect of the present invention, there is provided a single poly EEPROM device including a single poly EEPROM cell, wherein the single poly EEPROM cell includes a second control gate capacitor MC3 having a first terminal and a second terminal connected to a control gate (CG) signal and a third terminal connected to a floating gate FG, a second tunnel gate transistor MN3 having a second terminal connected to a tunnel gate (TG) signal and a third terminal connected to the floating gate FG, and a second selection transistor MN4 having a first terminal connected to a bit line (BL) signal, a second terminal connected to a first terminal of the second tunnel gate transistor MN3, and a third terminal connected to a word line (WL) signal, wherein the second tunnel gate transistor MN3 and the second selection transistor MN4 share a P type well PW.

BRIEF DESCRIPTION OF THE DRAWINGS

The above objects, and other features and advantages of the present invention will become more apparent after a reading of the following detailed description taken in conjunction with the drawings, in which:

FIG. 3 shows an embodiment of a bias voltage condition when the single poly EEPROM cell according to the present invention is in erase mode;

FIG. 4 shows an embodiment of a bias voltage condition when the single poly EEPROM cell according to the present invention is in program mode;

FIG. 5 shows an embodiment of a bias voltage condition when the single poly EEPROM cell according to the present invention is in read mode;

FIG. 6 shows an embodiment of threshold voltage ($V_T$) measurement conditions according to modes in the single poly EEPROM cell according to the present invention;

DETAILED DESCRIPTION OF PREFERRED EMBODIMENTS

Figure 1:
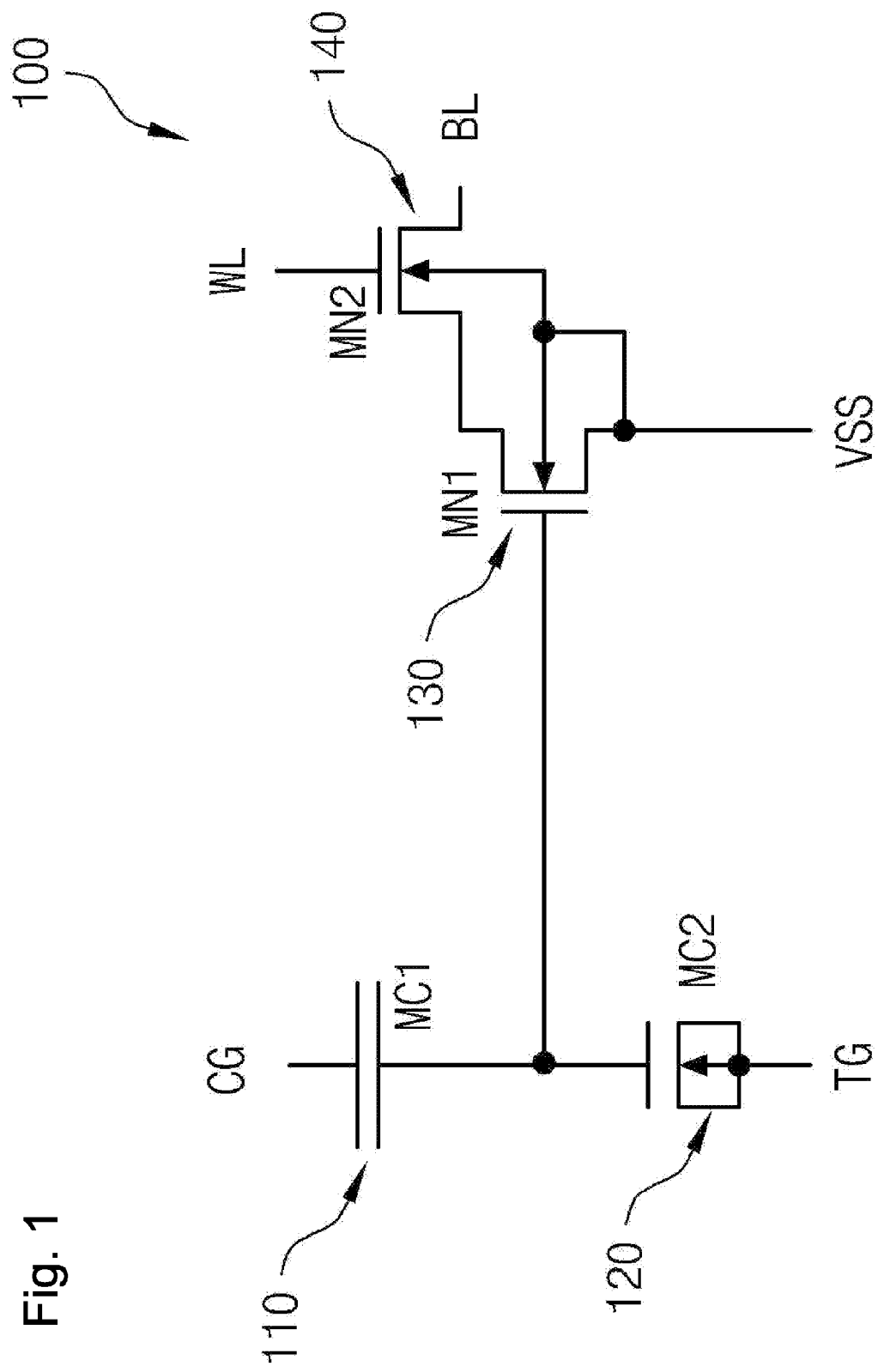
FIG. 1 shows an embodiment of a circuit diagram of a single poly EEPROM cell used in a single poly EEPROM device according to the present invention.

Reference will now be made in greater detail to a preferred embodiment of the invention, an example of which is illustrated in the accompanying drawings. Wherever possible, the same reference numerals will be used throughout the drawings and the description to refer to the same or like parts.

FIG. 1 shows an embodiment of a circuit diagram of a single poly EEPROM cell used in a single poly EEPROM device according to the present invention.

The single poly EEPROM cell 100 according to the present invention, as shown in FIG. 1, includes a first control gate capacitor MC1 110, a first tunnel gate capacitor MC2 120, a first sense transistor MN1 130, and a first selection transistor MN2 140.

A single poly EEPROM device is formed of a single poly EEPROM cell.

The single poly EEPROM cell 100 includes the first control gate capacitor MC1 110 having a first terminal to which a control gate (CG) signal is connected.

The first tunnel gate capacitor MC2 has a first terminal and a second terminal to which a tunnel gate (TG) signal is connected and a third terminal connected to the second terminal of the first control gate capacitor MC1 110.

The third terminal of the first tunnel gate capacitor MC2 120 is connected to the second terminal of the first control gate capacitor.

The first sense transistor MN1 130 has a second terminal connected to a virtual ground VSS and a third terminal connected to the second terminal of the first control gate capacitor terminal.

The first selection transistor MN2 140 has a first terminal to which a bit line (BL) signal is connected, a second terminal connected to the first terminal of the first sense transistor MN1 130, and a third terminal connected to a word line (WL) signal.

The first sense transistor MN1 130 and the first selection transistor MN2 140 share a P type well PW.

The first sense transistor MN1 130 discharges electrons from a floating gate FG or injects electrons into the floating gate FG in accordance with the FN tunneling method.

The first tunnel gate capacitor MC2 120 plays a role as a coupling capacitor.

The first selection transistor MN2 140 reduces an off leakage current when over-erase is generated.

The first control gate capacitor MC1, the first tunnel gate capacitor MC2 120, the first sense transistor MN1 130, and the first selection transistor MN2 140 share a deep N well DNW.

Figure 2:
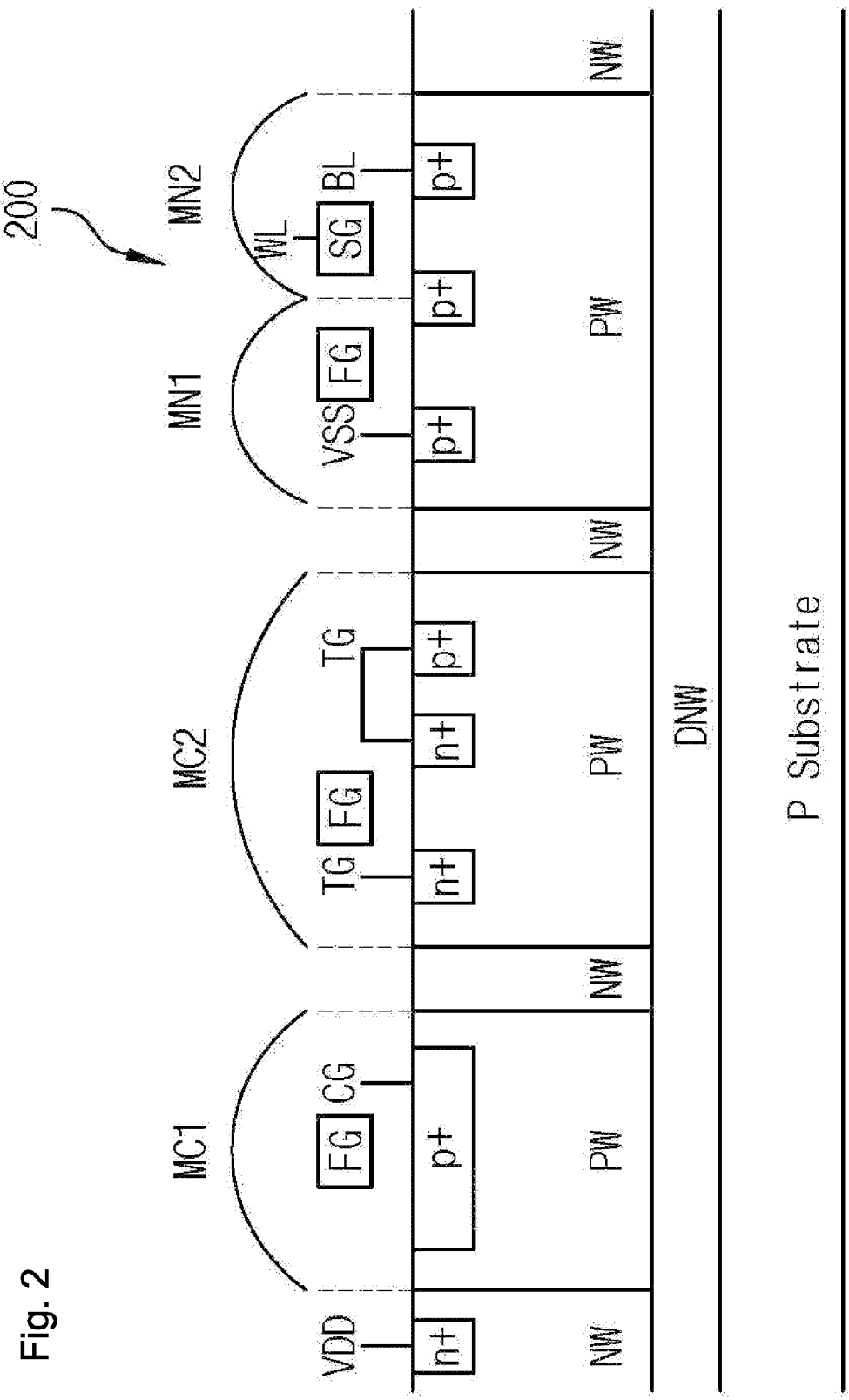
FIG. 2 shows an embodiment of a process cross section of the single poly EEPROM cell used in the single poly EEPROM device according to the present invention.

FIG. 2 shows an embodiment of a process cross section of the single poly EEPROM cell used in the single poly EEPROM device according to the present invention.

In the present invention, the deep N well DNW of a cell array is shared in order to reduce the size of a single poly EEPROM cell.

Furthermore, the first sense transistor and the first selection transistor share a P type well PW.

FN tunneling is generated in the first tunnel gate capacitor MC2 120 in erase mode and program mode.

The FN tunneling method is a quantum tunnel effect and a method of electrically rewriting data using FN tunneling.

The single poly EEPROM cell according to the present invention uses the FN tunneling method in order to increase the recognition distance of an RFID tag chip in erase mode and program mode.

The control gate signals CG [7:0] and the word line signals WL [7:0] are routed in a row direction, and the bit line signals BL [15:0] and the tunnel gate signals TG [15:0] are routed in a column direction.

FIGS. 3, 4, and 5 shows bias voltage conditions for the single poly EEPROM cell according to the present invention according to modes.

FIG. 3 shows an embodiment of a bias voltage condition when the single poly EEPROM cell according to the present invention is in erase mode.

Electrons are discharged from a floating gate FG in accordance with the FN tunneling method by applying a control gate (CG) signal of −4.75 V and a tunnel gate (TG) signal of +4.75 V to a selected single poly EEPROM cell in erase mode.

FIG. 4 shows an embodiment of a bias voltage condition when the single poly EEPROM cell according to the present invention is in program mode.

In program mode, a control gate (CG) signal of +4.75 V and a tunnel gate (TG) signal of −4.75 V are applied to a selected single poly EEPROM cell.

In program mode, electrons are injected into a floating gate FG in accordance with the same FN tunneling method as erase mode.

FIG. 5 shows an embodiment of a bias voltage condition when the single poly EEPROM cell according to the present invention is in read mode.

In read mode, an erased single poly EEPROM cell outputs 0 V to a bit line (BL) signal.

A programmed single poly EEPROM cell is precharged with a power source voltage VDD from which a threshold voltage $V_T$ has been subtracted due to a loss of the threshold voltage $V_T$ of the NMOS transistor of the first selection transistor MN2.

The reason why only an NMOS transistor is used in the first selection transistor MN2 instead of a CMOS transfer gate is as follows.

An access time can be reduced due to a fast discharge time if an erased single poly EEPROM cell is charged with a power source voltage VDD from which a threshold voltage $V_T$ has been subtracted.

The time taken to program the single poly EEPROM cell is 1 ms.

FIG. 6 shows an embodiment of threshold voltage ($V_T$) measurement conditions according to modes in the single poly EEPROM cell according to the present invention.

FIG. 6 shows a table illustrating conditions on which bias voltages are applied in erase mode, program mode, and read mode in order to measure threshold voltages $V_T$ when the single poly EEPROM cell is in erase mode and threshold voltages $V_T$ when the single poly EEPROM cell is in program mode.

In order to measure threshold voltages $V_T$ in a single poly EEPROM cell, the tunnel gate (TG) signal, the word line (WL) signal, and the bit line (BL) signal having respective voltages of 0 V, 1.2 V, and 0.1 V are applied to the single poly EEPROM cell in read mode after programming, and a control gate (CG) signal is swept.

Figure 7:
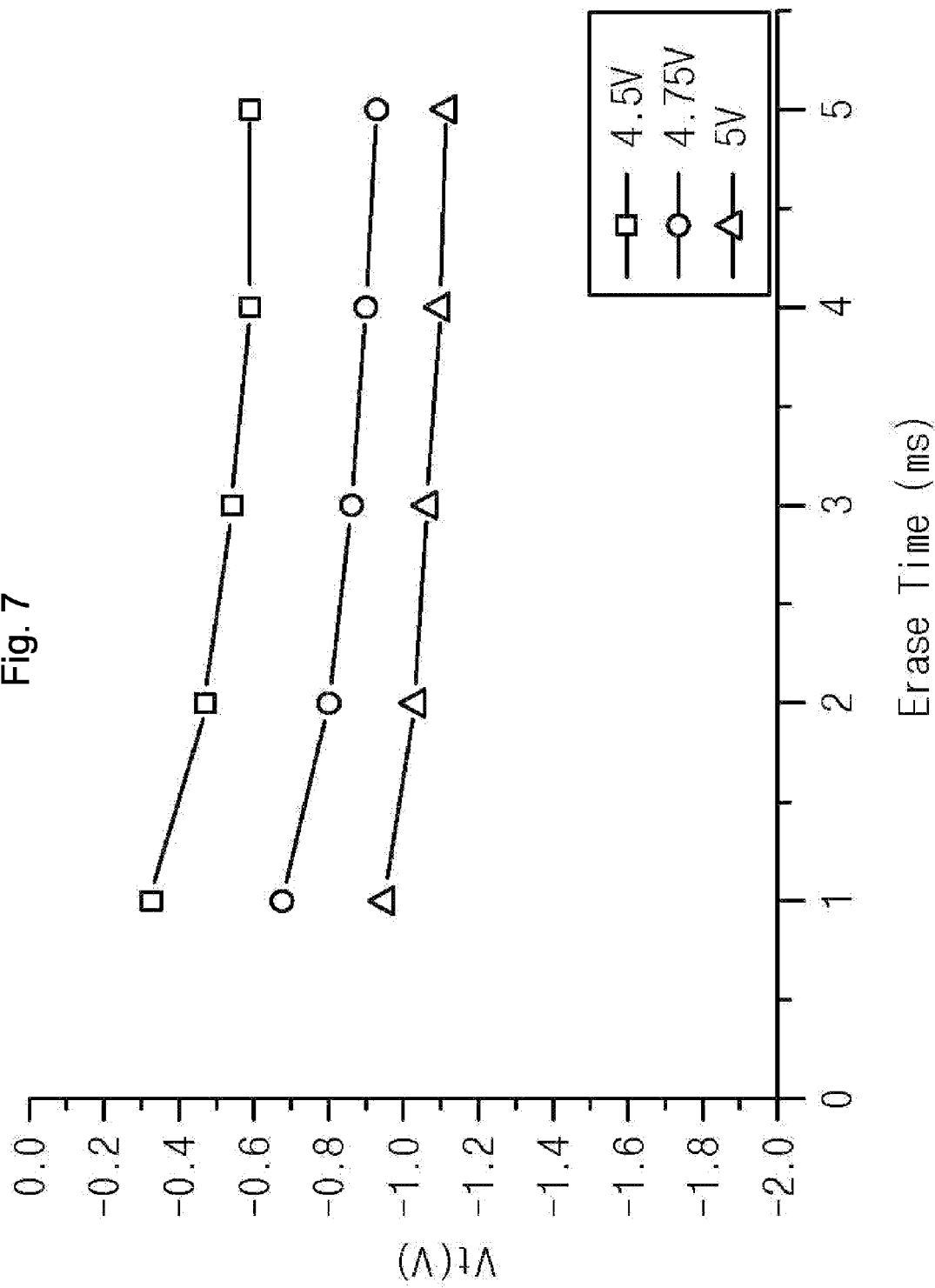
FIG. 7 shows an embodiment of the results of a threshold voltage $V_T$ measured in erase mode according to the erase time of the single poly EEPROM device according to the present invention.

FIG. 7 shows an embodiment of the results of a threshold voltage $V_T$ measured in erase mode according to the erase time of the single poly EEPROM device according to the present invention.

Figure 8:
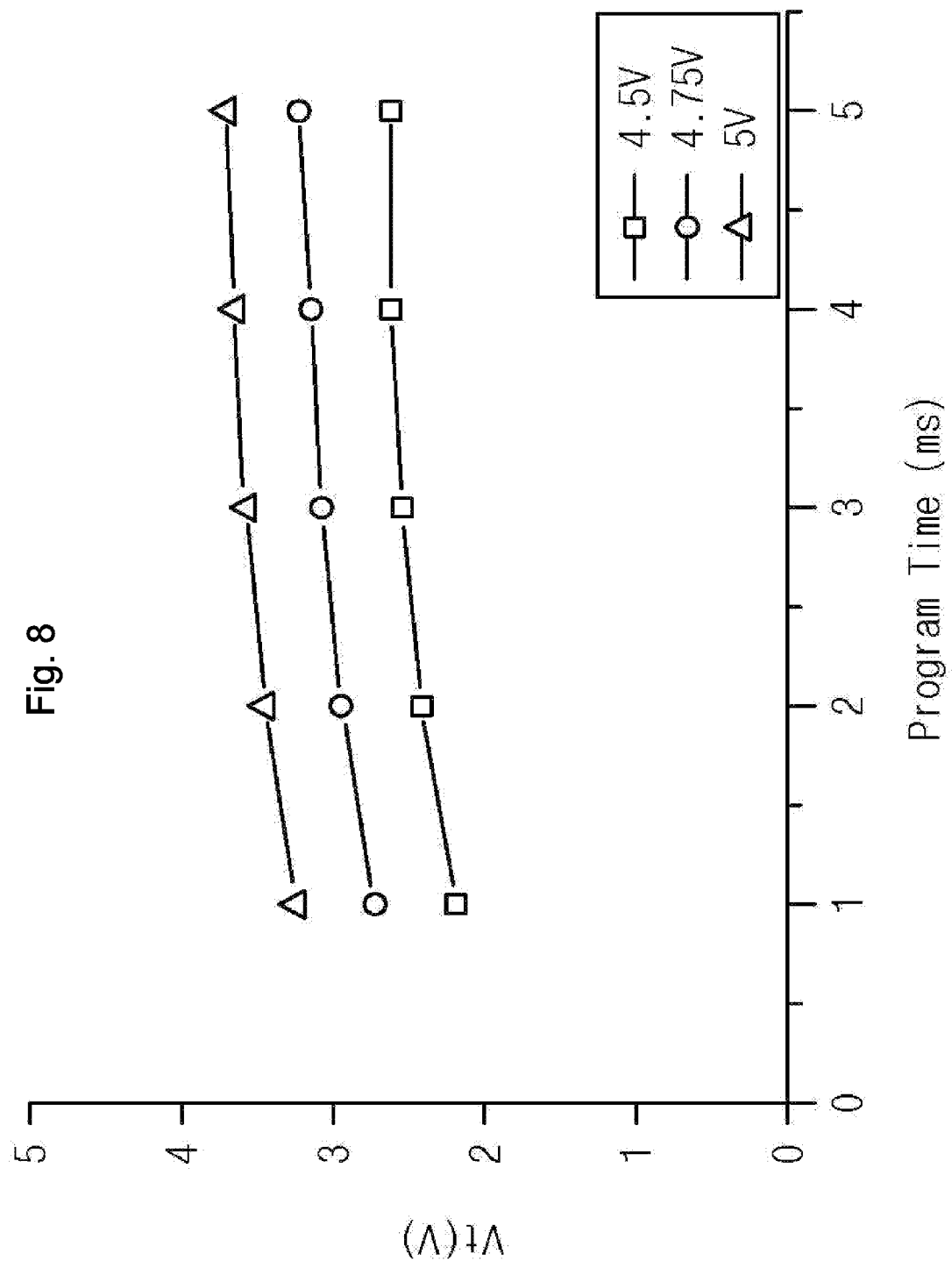
FIG. 8 shows an embodiment of the results of a threshold voltage $V_T$ measured in program mode according to the program time of the single poly EEPROM device according to the present invention.

FIG. 8 shows an embodiment of the results of a threshold voltage $V_T$ measured in program mode according to the program time of the single poly EEPROM device according to the present invention.

FIGS. 7 and 8 show the results of characteristics of threshold voltages $V_T$ measured after program voltages are changed into ±4.5 V, ±4.75 V, and ±5 V.

It can be seen that in erase mode, the threshold voltage $V_T$ becomes low as the program voltage is increased and the erase time is increased.

Furthermore, it can be seen that in program mode, the threshold voltage $V_T$ becomes high as the program voltage is increased and the program time is increased.

A single poly EEPROM cell that has been erased is called an erased single poly EEPROM cell, and a single poly EEPROM cell that has been programmed is called a programmed single poly EEPROM cell.

The threshold voltage $V_T$ of a programmed single poly EEPROM cell is VTP, and the threshold voltage $V_T$ of an erased single poly EEPROM cell is VTE.

Figure 9:
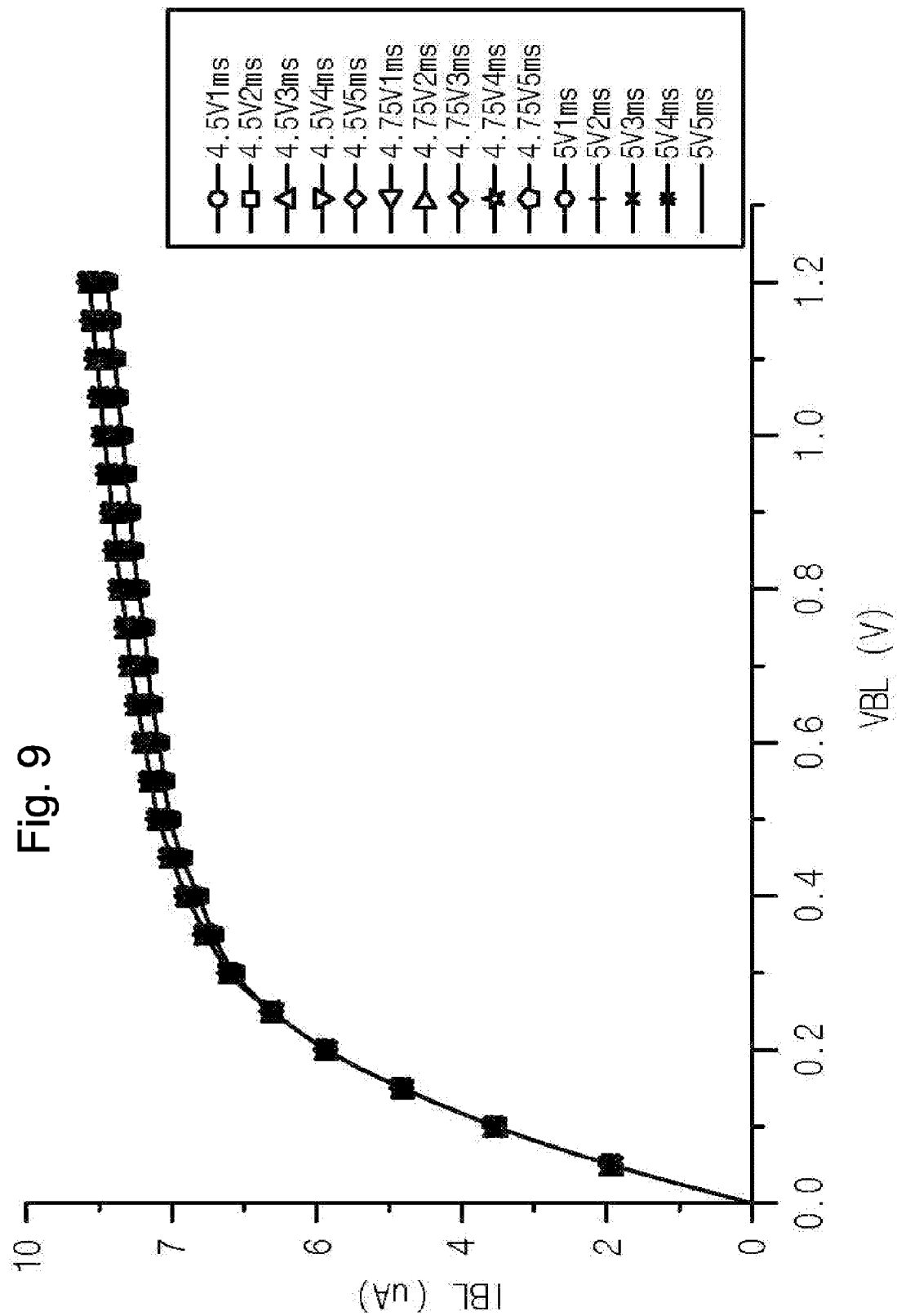
FIG. 9 shows an embodiment of the results of a change of a bit line current IBL that was measured according to a change of a bit line voltage VBL when the single poly EEPROM cell of the single poly EEPROM device according to the present invention is in erase mode.

FIG. 9 shows an embodiment of the results of a change of a bit line current IBL that was measured according to a change of a bit line voltage VBL when the single poly EEPROM cell of the single poly EEPROM device according to the present invention is in erase mode.

It can be seen that a bit line current IBL has a higher value according to an increase in a bit line voltage VBL.

FIG. 9 shows the results of bit line currents IBL measured while sweeping the bit line voltage VBL of the single poly EEPROM cell having a bias condition in erase mode.

Figure 10:
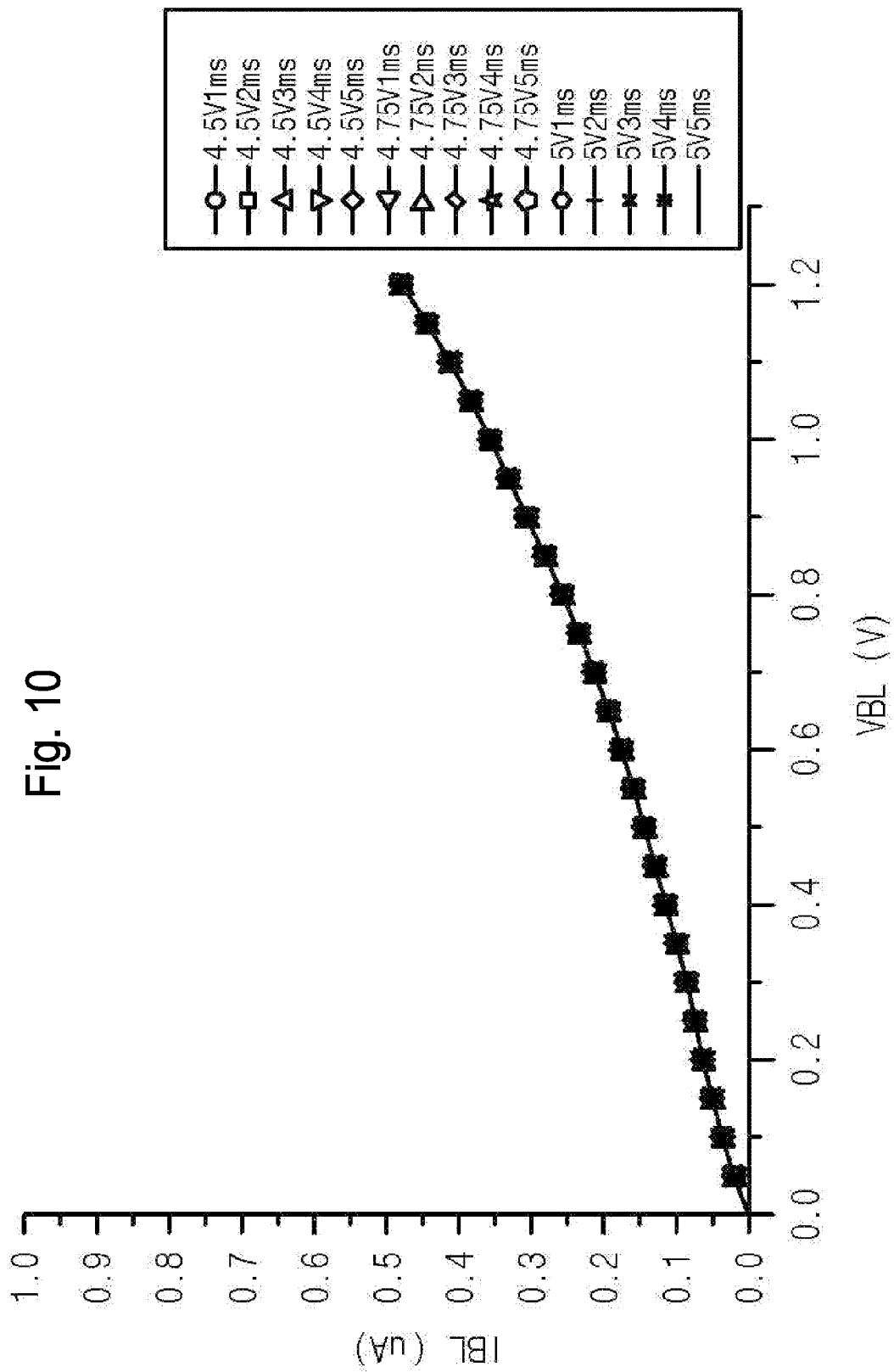
FIG. 10 shows an embodiment of the results of a change of a bit line current IBL that was measured according to a change of a bit line voltage VBL when the single poly EEPROM cell of the single poly EEPROM device according to the present invention is in program mode.

FIG. 10 shows an embodiment of the results of a change of a bit line current IBL that was measured according to a change of a bit line voltage VBL when the single poly EEPROM cell of the single poly EEPROM device according to the present invention is in program mode.

FIG. 10 shows the results of bit line currents IBL measured while sweeping the bit line voltage VBL of the single poly EEPROM cell having a bias condition in program mode.

The program time was varied from 1 ms to 5 ms at an interval of 1 ms, and the bit line currents IBL of the erased single poly EEPROM cell were measured while changing a second voltage VPP voltage into 4.5 V, 4.75 V, and 5 V. Furthermore, when measuring a read current, the control gate signal having voltage of 1.2 V is applied.

Figure 11:
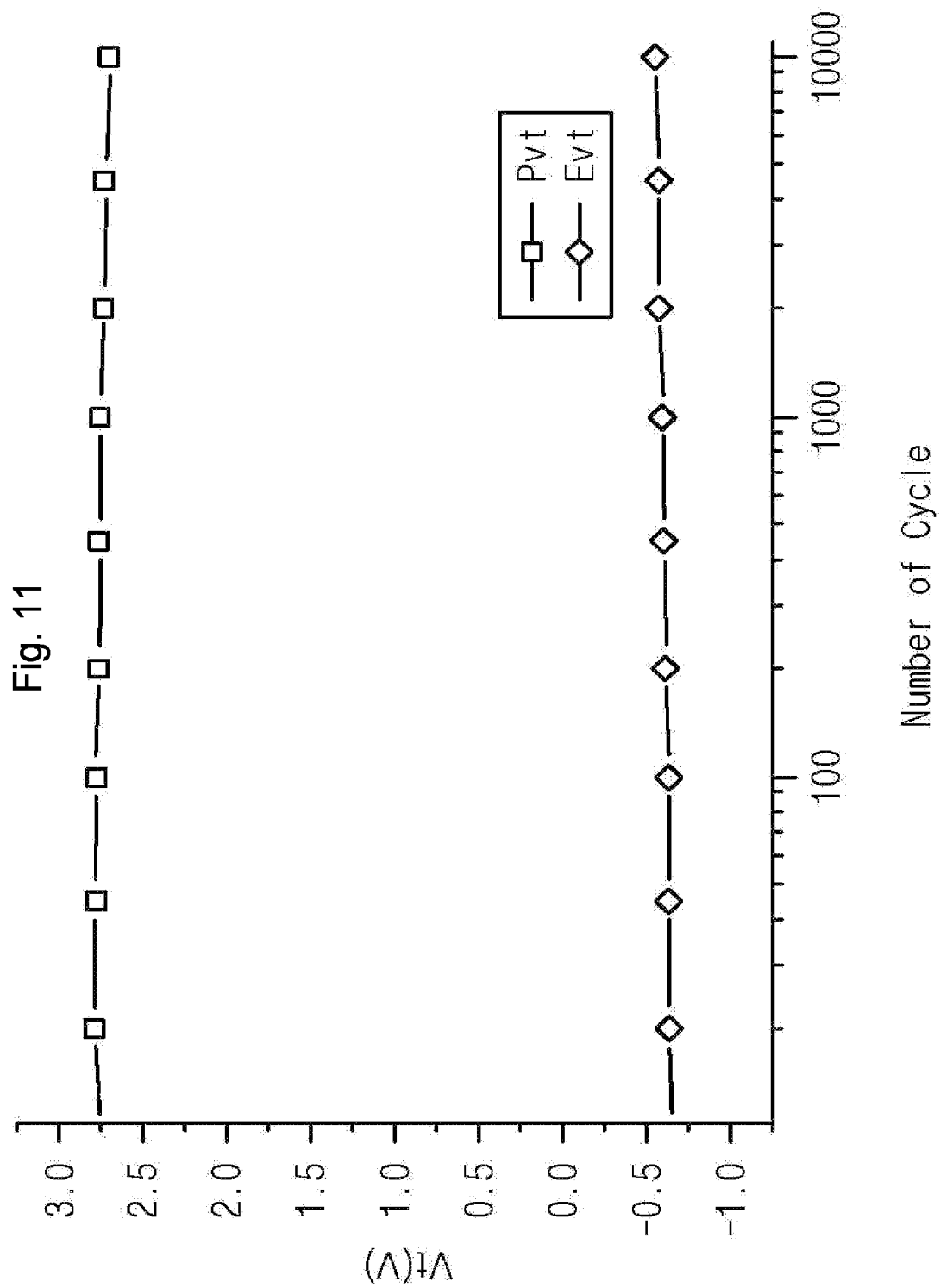
FIG. 11 shows an embodiment of the results of measured endurance of the single poly EEPROM cell of the single poly EEPROM device according to the present invention.

FIG. 11 shows an embodiment of the results of measured endurance of the single poly EEPROM cell of the single poly EEPROM device according to the present invention.

FIG. 11 shows the results of endurance measured for the single poly EEPROM cell according to the number of cycle. A second voltage VPP is 4.75 V, a read voltage is 1.2 V, and a program time is 1 ms.

The results of measured endurance EVt for an erased cell and the results of measured endurance PVt for a program cell show that there is almost no change of a threshold voltage $V_T$ although 10,000 program cycles are performed.

Figure 12:
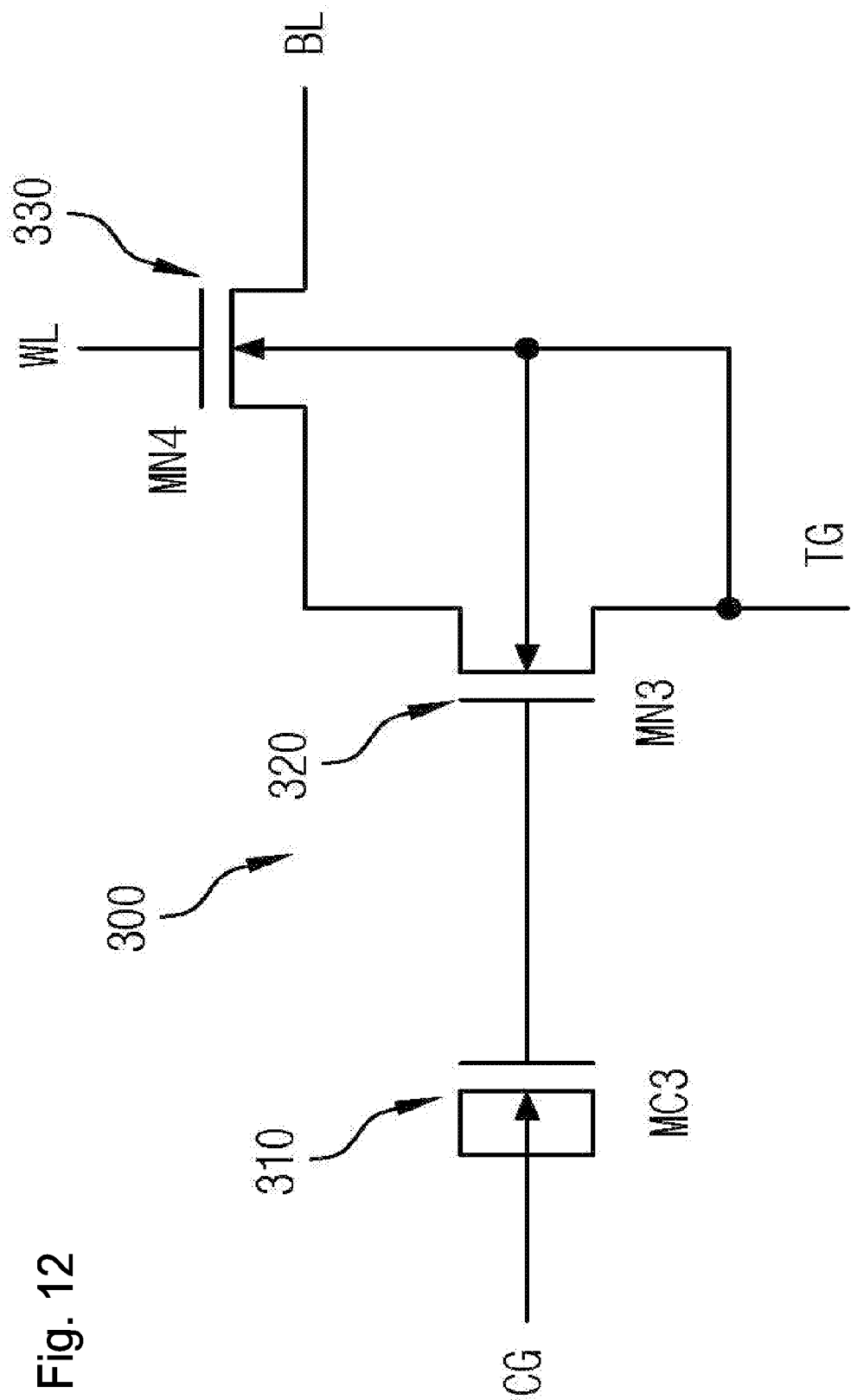
FIG. 12 shows another embodiment of a circuit diagram that forms a single poly EEPROM cell used in the single poly EEPROM device according to the present invention.
Figure 13:
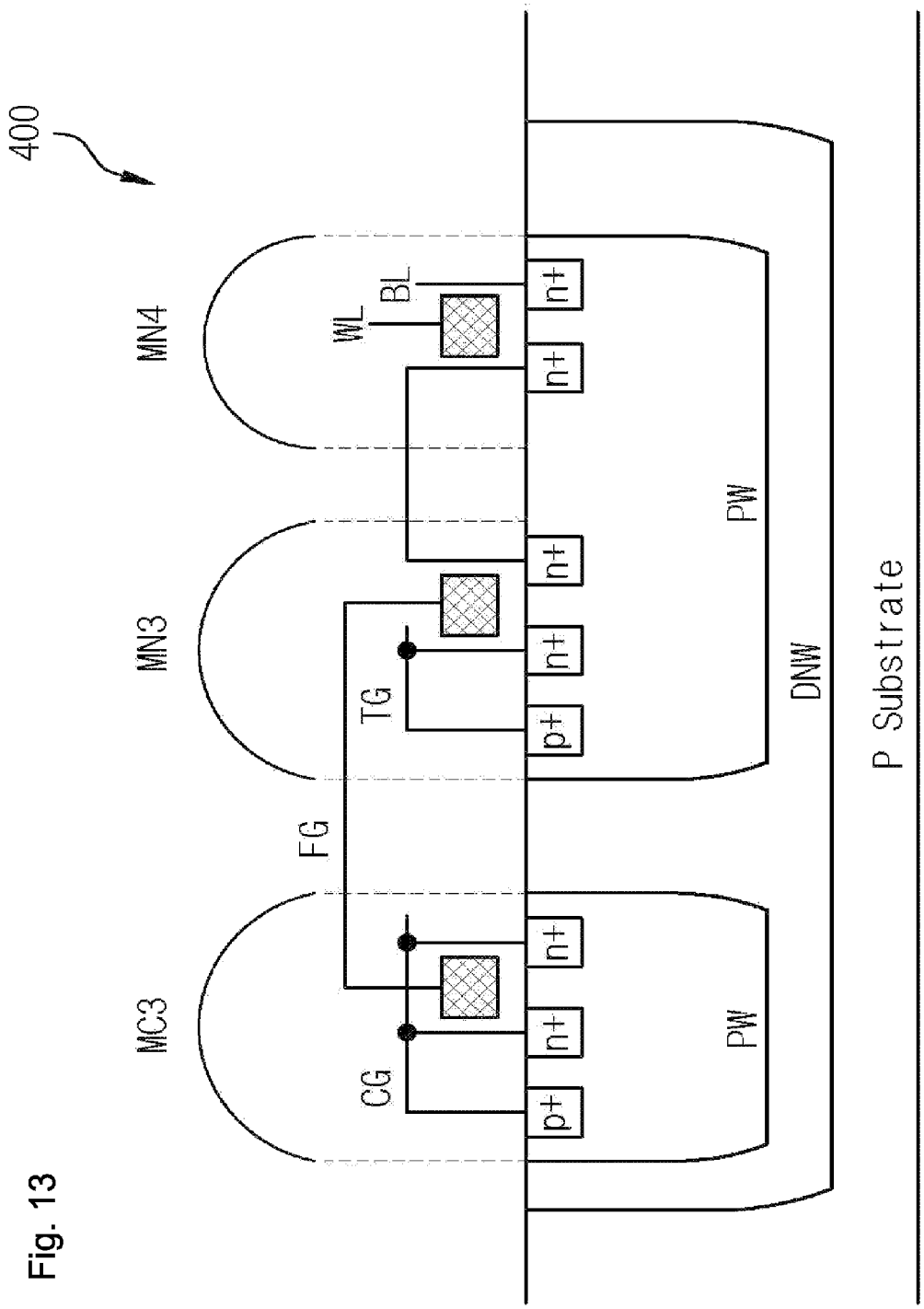
FIG. 13 shows another embodiment of a process cross section of the single poly EEPROM cell used in the single poly EEPROM device according to the present invention.

FIGS. 12 and 13 are another embodiment and a process cross section of a circuit diagram that forms a single poly EEPROM cell used in the single poly EEPROM device according to the present invention.

A single poly EEPROM cell used in a single poly EEPROM device according to the present invention may have the following structure.

The single poly EEPROM cell includes a second control gate capacitor MC3 310 and a second tunnel gate transistor MN3 320 for discharging the electrons of a floating gate FG in accordance with an FN tunneling method and a second selection transistor MN4 330 for reducing an off leakage current when the single poly EEPROM cell is over erased.

A single poly EEPROM device may include a single poly EEPROM cell in which the deep N well (DNW) of a cell array is shared and a P type well PW is shared by the second tunnel gate capacitor MN3 and the second selection transistor MN4.

In the present invention, in order to reduce the size of a single poly EEPROM cell based on a CMOS process, the deep N well (DNW) of the cell array is shared, and the number of MOS devices used is reduced to three.

Furthermore, the P type well PW is shared by the second tunnel gate transistor MN3 320 and the second selection transistor MN4 330.

As compared with the embodiment of FIG. 1, the second tunnel gate transistor MN3 320 functions as a first tunnel gate (TG) transistor in which tunneling is generated in erase mode and program mode. Furthermore, the second tunnel gate transistor MN3 320 functions as a first sense transistor in read mode.

As is apparent from the above description, the single poly EEPROM device according to the present invention is advantageous in that an FN tunneling method is used in order to increase the recognition distance of an RFID tag chip in erase mode and program mode, the chip size of a single poly EEPROM device including the single poly EEPROM cell can be reduced, and the number of MOS devices used can be reduced.

Although a preferred embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A single poly EEPROM device comprising a single poly EEPROM cell having at least one operation modes, wherein the single poly EEPROM cell comprises:
   a control gate capacitor formed on a p+/n+/n+ junction structure in a P type well having a first terminal, a second terminal, and a third terminal, wherein the first terminal and the second terminal are connected to a control gate signal and the third terminal is connected to a floating gate;
   a tunnel gate transistor formed on a p+/n+/n+ junction structure having a first terminal, a second terminal, and a third terminal, wherein the second terminal of the tunnel gate transistor is connected to a tunnel gate signal and the third terminal of the tunnel gate transistor is connected to the floating gate; and
   a selection transistor formed on an n+/n+ junction structure having a first terminal connected to a bit line signal, a second terminal connected to the first terminal of the tunnel gate transistor, and a third terminal connected to a word line signal,
   wherein the tunnel gate transistor and the selection transistor are formed in a shared P type well, and a polarity of the tunnel gate signal is opposite to a polarity of the control gate signal in one of the at least one operation modes, and
   wherein the control gate capacitor in the P type well is formed in a DNW layer shared with the tunnel gate transistor and the selection transistor both formed in the shared P type well.

2. The single poly EEPROM device of claim 1, wherein the tunnel gate transistor discharges electrons of the floating gate or injects electrons into the floating gate in accordance with a Fowler Nordheim tunneling method.

3. The single poly EEPROM device of claim 1, wherein the control gate capacitor plays a role as a coupling capacitor.

4. The single poly EEPROM device of claim 1, wherein the selection transistor reduces an off leakage current when over erase is generated.

5. The single poly EEPROM device of claim 1, wherein the at least one operation modes includes an erase mode, and in the erase mode the control gate signal is −4.75V and the tunnel gate signal is +4.75 V.

6. The single poly EEPROM device of claim 1, wherein the at least one operation modes includes a program mode, and in the program mode the control gate signal is +4.75V and the tunnel gate signal is −4.75V.

7. The single poly EEPROM device of claim 1, wherein the at least one operation modes includes a read mode, and in the read mode the control gate signal is swept and the tunnel gate signal is 0V.

* * * * *